United States Patent
Chan et al.

(10) Patent No.: US 8,237,481 B2
(45) Date of Patent: Aug. 7, 2012

(54) LOW POWER PROGRAMMABLE CLOCK DELAY GENERATOR WITH INTEGRATED DECODE FUNCTION

(75) Inventors: Yuen H. Chan, Poughkeepsie, NY (US); Rolf Sautter, Bondorf (DE); Michael J. Lee, Austin, TX (US); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/109,728

(22) Filed: Apr. 25, 2008

(65) Prior Publication Data

US 2009/0267667 A1    Oct. 29, 2009

(51) Int. Cl.
*H03H 11/26* (2006.01)
*G06F 1/04* (2006.01)
*H03K 17/284* (2006.01)

(52) U.S. Cl. ........ 327/261; 327/107; 327/264; 327/276; 327/278; 327/291; 327/299; 327/392

(58) Field of Classification Search .................. 327/107, 327/124, 235, 237, 250, 261, 264, 276–278, 327/284, 291, 299, 392–396
See application file for complete search history.

(56) References Cited

U.S. PATENT DOCUMENTS

| | | | |
|---|---|---|---|
| 6,236,695 B1 * | 5/2001 | Taylor ........................... | 375/372 |
| 6,850,460 B1 * | 2/2005 | Chan et al. ..................... | 365/194 |
| 7,212,056 B1 * | 5/2007 | Belov ............................. | 327/210 |
| 7,602,877 B2 * | 10/2009 | Shimada ......................... | 377/47 |
| 7,612,597 B2 * | 11/2009 | Matsumoto .................... | 327/291 |
| 2007/0288781 A1 * | 12/2007 | Macri et al. .................... | 713/322 |

* cited by examiner

*Primary Examiner* — Lincoln Donovan
*Assistant Examiner* — Colleen O Toole
(74) *Attorney, Agent, or Firm* — Cantor Colburn LLP; William A. Kinnaman, Jr.

(57) ABSTRACT

A programmable Local Clock Buffer has a single inverter between the clock input and the delayed clock output. A transistor switch modulates the single inverter stage between a clock signal transmit state and a non-transmitting state. A combination of delay select bits control the timing of the beginning and ending of the transmit state of the inverter relative to the clock input via the transistor switch.

5 Claims, 2 Drawing Sheets

LOW POWER PROGRAMMABLE CLOCK DELAY GENERATOR WITH INTEGRATED DECODE FUNCTION

FIELD OF THE INVENTION

This invention relates to a method and apparatus for generating a local clock signal, and more particularly to an improved programmable local clock generator.

BACKGROUND OF THE INVENTION

High performance arrays in an integrated circuit system, such as an SRAM in a processor system, typically use a local clock generator circuit to control the internal circuit timing of the array. Such array local clock generators (also referred to as a Local Clock Buffer or LCB) are used to control critical circuit functions of the array, such as word decode/bit decode and read/write functions. In order to provide flexibility in tuning the timing of the array circuit function and an ability to change the array circuit timing as part of a hardware debugging process, a state of the art LCB will often have a programmable control circuit that can alter the delay of the local clock relative to the system clock and can alter the local clock pulse width. In the prior art, a programmable control input to an explicit decoder typically selects the number of elements in an inverter delay chain. Discreet decoders and separate discreet delay chains used in the prior art result in a Local Clock Buffer that is complex, requires a substantial area of the chip to implement, and requires substantial power to operate.

SUMMARY OF THE INVENTION

An object of this invention is the provision of an array local clock generator circuit topology that is simple to implement and requires only a small amount of power to operate.

Another object of the invention is the provision of a delay chain topology that is simpler to implement as compared to the typical prior art inverter delay chain.

Briefly, this invention contemplates a programmable Local Clock Buffer with a single inverter between the clock input and the delayed clock output. A transistor switch modulates the single inverter stage between a clock signal transmit state and a non-transmitting state. A combination of delay select bits control the timing of the beginning and ending of the transmit state of the inverter relative to the clock input via the transistor switch.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
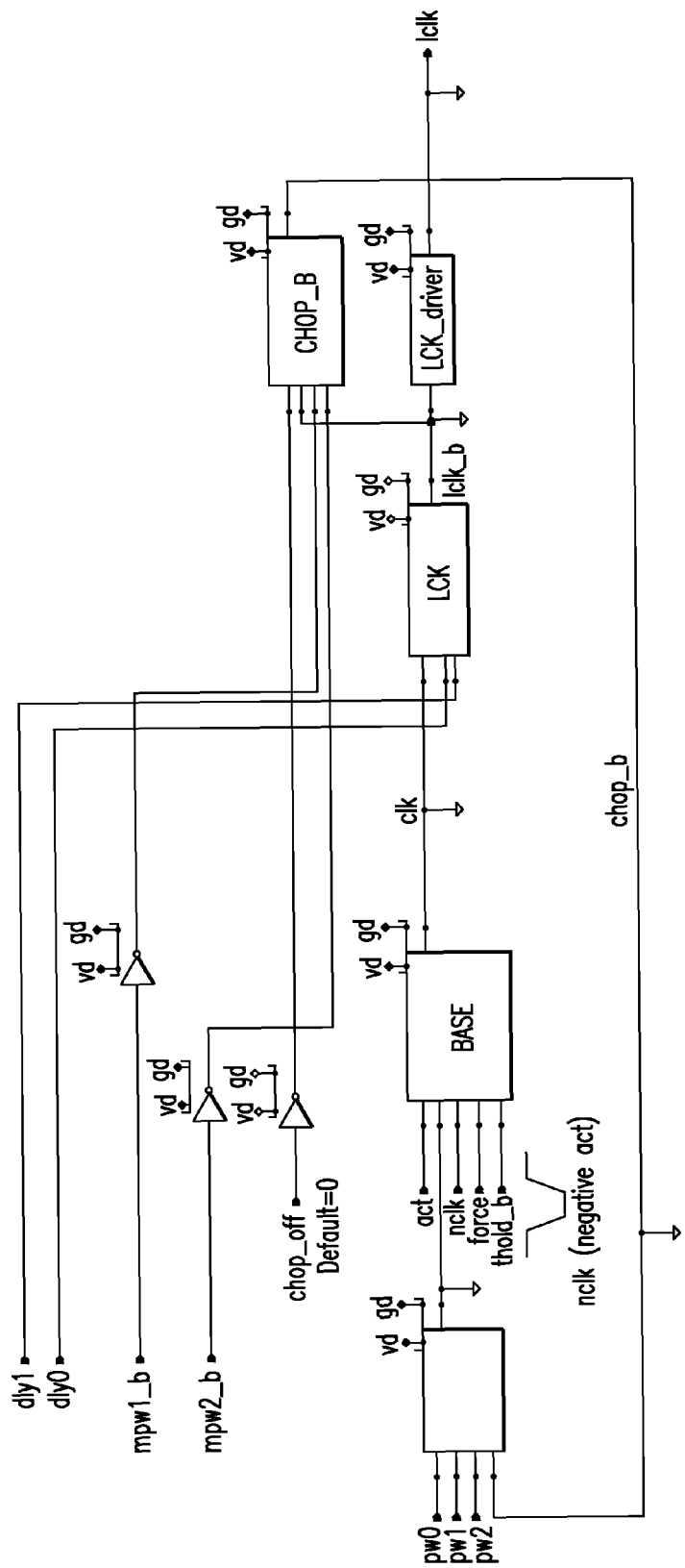
FIG. 1 is a partially schematic and partially block diagram of a programmable clock generator for an array in which the programmable clock generator of FIG. 2 can be used.
Figure 2:
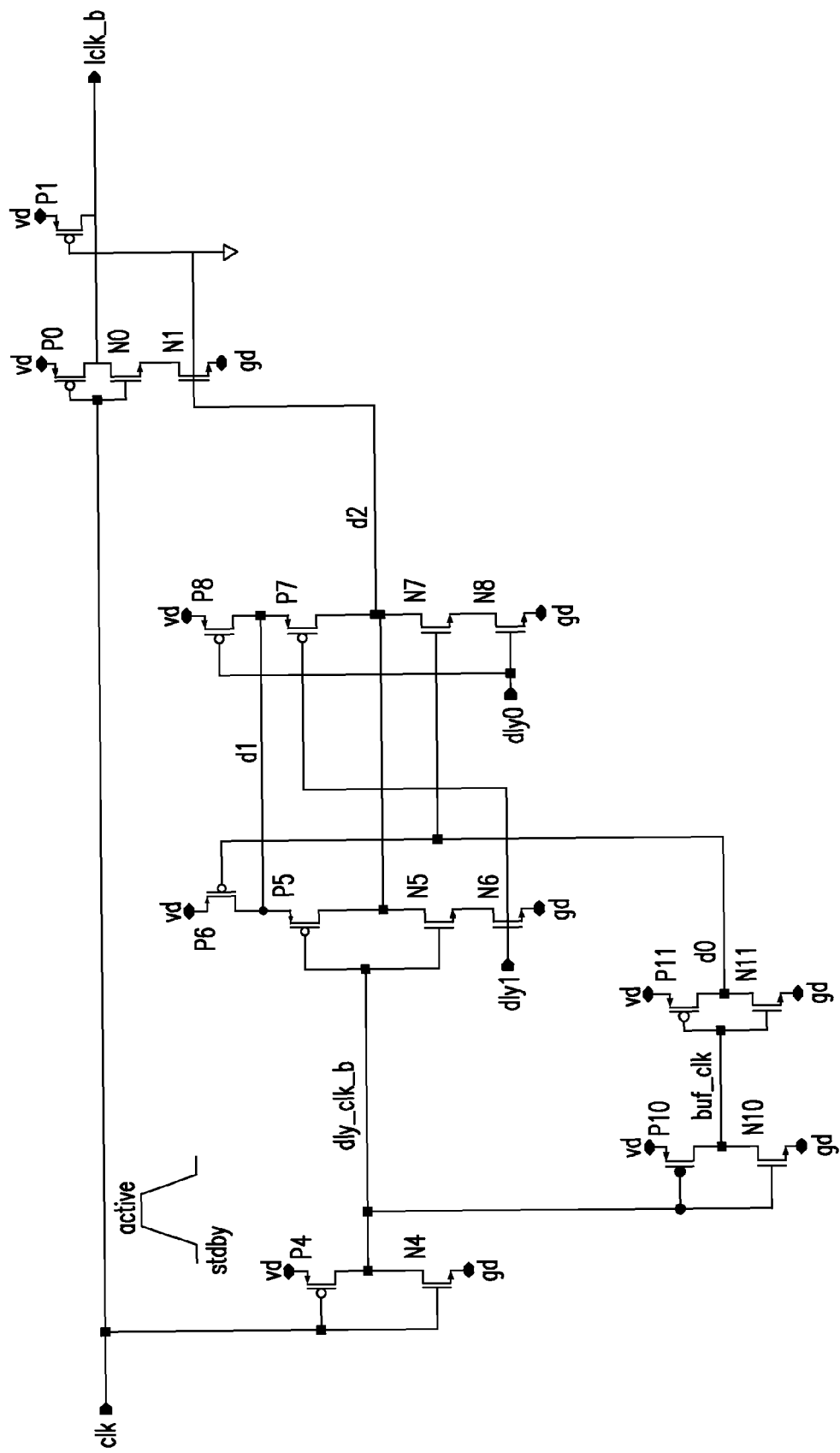
FIG. 2 is a schematic diagram of one embodiment of a programmable array clock generator in accordance with the teaching of this invention.

Referring briefly to FIG. 1, it discloses a state of the art array Local Clock Buffer system in which the programmable clock delay circuit of FIG. 2 can be used advantageously. The system of FIG. 1 is comprised of several blocks to provide various clock control functions. These functional blocks include a BASE block for LCB input control; a LCK block for providing programmable clock delay control, which will be explained in detail in connection with FIG. 2; a CHOP_B block for clock chopper control; a pwvar block for programmable clock pulse width control; and an LCK_driver block for driving the output of the LCB.

Referring now to FIG. 2, a system clock input clk is coupled as an input to a first inverter PN transistor pair P0, N0 connected in series between Vd and gd by N transistor N1. The delayed clock output terminal lck_b is coupled to the output of the first inverter P0, N0. The system clock input clk also is coupled as an input to a second inverter PN transistor pair P4, N4. The output dly_clk_b of this second inverter coupled as an input to P transistor P5 and N transistor N5 and also as an input to a third inverter PN transistor pair P10, N10. The output of the third inverter is coupled as an input to a fourth inverter PN transistor pair P11, N11. Transistors P5 and N5 are part of a first transistor stack between Vd and gd. This first transistor stack also includes P transistor P6 and N transistor N6. A second transistor stack similar to the first includes P transistors P7 and P8 and N transistors N7 and N8. The output of the fourth inverter is coupled as an input to the gate of transistor P6 and as an input to the gate of transistor N7. The clock delay select input dly1 is coupled as an input to the gate of transistor N6 and to the gate of transistor P7. The delay select input dly0 is coupled as an input to the gate of transistor N8 and to the gate of transistor P8. The node d2 between P7 and N7 is coupled to the gate of transistor N1 and the gate of transistor P1 so that the dc state of this node d2 modulates conduction of the system clock signal through the first inverter, P0, N0.

In operation of this exemplary embodiment of the invention, the programmable clock delay circuit uses two mode bits dly0 and dly1 to provide three delay settings, fast (that is minimal delay), normal or nominal delay, and slow (that is maximum delay). The two-to-three decode function is combined with the delay chains and the delay chains are configured with a modulated PFET/NFET inverter structure instead of the simple inverter chains of the prior art. In simple inverter delay chains, the delay elements are consist of series of PFET/NFET stacks. Switching of these various delay elements are controlled or enabled by simple input gating logic. The new modulated PFET/NFET inverter structure described here (P5-N5 to P8-N8 circuit topology) instead have the control/enable function merged with the multi-stack PFET/NFET devices. Switching of these PFET/NFET delay elements are therefore modulated by the delay input settings. The input clock clk is active high and the output clock lclk_b is active low.

With dly0 and dly1 both low (logical 0) P7 and P8 are both DC on, pulling node d2 up to Vd. Transistor N1 turns on and transistor P1 turns OFF. The input clock switches through the first inverter P0, N0 introducing only one inverter delay between the input clock clk and the output clock lclk_b, which provides the "fast" setting, that is, the minimum delay.

With dly0 low and dly1 high, the inverter stack P7-P8/N7-N8 is held off, as the input clock clk transitions from its low inactive state to high active state, as a result of the high input to P7 and low input to N8. Node d2 is low so the clock output lck_b remains initially high with conduction through inverter P0, N0 blocked and P1 connecting the output terminal lck_b to Vd. The clock signal clk switches through inverter P4, N4 and then through the P5, P6 stack pulling node d2 up to Vd, enabling inverter P0, N0 and turning off P1. The delay is three inverter stages long in total, and two stages longer than the so-called "fast" setting of the previous paragraph. This three-inverter delay is the "nominal" setting.

With dly0 high (logical 1) the state of dly1 is immaterial, and the dly0 high state selects the so-called "slow" setting. With dly0 high P8 is turned off, and the N7-N8 stack is enabled and node d2 is low initially. The input clock clk switches through inverter P4-N4, next through inverter P10-N10, and then through inverter P11-N11. The inverted clock signal output dly_clk_b of the P4-N4 inverter first turns on P5 after a one-inverter delay, then waits for the switching of P6 to come through after two-inverters delay. Inverted clock signal output of inverter P11-N11 turns on P6 and turns off N7 after a three-inverter delay. With P5 and P6 both on, they pull node d2 up to Vd, enabling the inverter P0-N0, and providing a five inverter delay. P5-P6 and N7-N8 are part of the five-inverter delay path between the clock input clk and the clock output lclk_b, which is two inverter delay stages longer than the nominal setting.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A programmable local clock buffer comprising in combination:
   an inverter coupled between a clock input terminal and a delayed clock output terminal and controlled by a control element coupled between the inverter and ground;
   a transistor switch coupled to said inverter responsive to a delay input signal that modulates the inverter between a state in which a clock signal coupled to the clock input terminal is transmitted to the delayed clock output terminal and a state in which the clock signal coupled to the clock signal input terminal is not transmitted to the delayed clock output terminal;
   a multi stage delay circuit coupled to said clock input terminal to generate said delay input signal in response to a plurality of delay select bits, the delay circuit including at least two stages, each stage being formed by at least two transistor stacks each including two serially coupled transistors and selected by the delay select bits, the at least two stages including a first stage having a first transistor, a second transistor, a third transistor and a fourth transistor, the second and third transistors being serially coupled and coupled between the first and fourth transistors, the first transistor being coupled to power and the fourth transistor being coupled to ground, the second stage having a fifth transistor, a sixth transistor, a seventh transistor and an eighth transistor, the sixth and seventh transistor being serially coupled between the fifth an eighth transistors and the sixth transistor being coupled directly to the fifth transistor, the fifth transistor being coupled to power and the eight transistor being coupled to ground, the first and seventh transistors having gates coupled directly to each other, the first and seventh transistors having gates coupled to the gates of the second and third transistors, the fifth and sixth transistors are directly coupled to the control element of the inverter, wherein the number of transistor stacks selected by the delay select bits determines an amount of delay imparted to the delay input signal.

2. A programmable local clock buffer as in claim 1 wherein two delay select bits can select zero stages of said multi stage delay circuit, or two stages, or four stages.

3. A programmable local clock buffer as in claim 1 wherein the minimum delay is the delay through said inverter coupled between the clock input terminal and the delayed clock output terminal.

4. A programmable local clock buffer as in claim 2 wherein the minimum delay is the delay through said inverter coupled between the clock input terminal and the delayed clock output terminal.

5. A programmable local clock buffer comprising in combination:
   an inverter means coupled between a clock input means and a delayed clock output means and controlled by a control element coupled between the inverter and ground;
   switch means coupled to said inverter means responsive to a delay input signal that modulates the inverter between a state in which a clock signal coupled to the clock input means is transmitted to the delayed clock output means and a state in which the clock signal coupled to the clock signal input means is not transmitted to the delayed clock output means;
   multi stage delay means coupled to said clock input means to generate said delay input signal in response to a plurality of delay select bits, the delay means including at least two stages, each stage being formed by at least two transistor stacks each including two serially coupled transistors and selected by the delay select bits, the at least two stages including a first stage having a first transistor, a second transistor, a third transistor and a fourth transistor, the second and third transistors being serially coupled and coupled between the first and fourth transistors, the first transistor being coupled to power and the fourth transistor being coupled to ground, the second stage having a fifth transistor, a sixth transistor, a seventh transistor and an eighth transistor, the sixth and seventh transistor being serially coupled between the fifth an eighth transistors and the sixth transistor being coupled directly to the fifth transistor, the fifth and sixth transistors are directly coupled to the control element of the inverter, the fifth transistor being coupled to power and the eight transistor being coupled to ground, the first and seventh transistors having gates coupled to directly to each other, the first and seventh transistors having gates coupled to the gates of the second and third transistors, wherein the number of transistor stacks selected by the delay select bits determines an amount of delay imparted to the delay input signal.

* * * * *